(12) United States Patent
Watanabe et al.

(10) Patent No.: US 8,521,459 B2
(45) Date of Patent: Aug. 27, 2013

(54) CAPACITOR'S REMAINING LIFETIME DIAGNOSING DEVICE, AND ELECTRIC POWER COMPENSATING DEVICE HAVING THE REMAINING LIFETIME DIAGNOSING DEVICE

(75) Inventors: Hiroyuki Watanabe, Tokyo (JP); Hiromichi Itoh, Tokyo (JP); Yoshitaka Sakai, Tokyo (JP)

(73) Assignee: Meidensha Corporation, Tokyo (JP)

( * ) Notice: Subject to any disclaimer, the term of this patent is extended or adjusted under 35 U.S.C. 154(b) by 380 days.

(21) Appl. No.: 12/996,311

(22) PCT Filed: Jun. 5, 2009

(86) PCT No.: PCT/JP2009/060376
§ 371 (c)(1),
(2), (4) Date: Feb. 11, 2011

(87) PCT Pub. No.: WO2009/148160
PCT Pub. Date: Dec. 10, 2009

(65) Prior Publication Data
US 2011/0125436 A1    May 26, 2011

(30) Foreign Application Priority Data
Jun. 6, 2008 (JP) .................................. 2008-148901

(51) Int. Cl.
*G06F 15/00* (2006.01)
(52) U.S. Cl.
USPC .......................................................... 702/65
(58) Field of Classification Search
USPC .......................................................... 703/65
See application file for complete search history.

(56) References Cited

U.S. PATENT DOCUMENTS
2003/0020478 A1 * 1/2003 Scott ............................. 324/426

FOREIGN PATENT DOCUMENTS
| JP | 3562633 | 6/2004 |
|---|---|---|
| JP | 4011016 | 9/2007 |
| JP | 2008-17691 | 1/2008 |
| JP | 2008-27946 | 2/2008 |
| JP | 2008-70296 | 3/2008 |

OTHER PUBLICATIONS

International Search Report received in corresponding International application No. PCT/JP2009/060376.

* cited by examiner

*Primary Examiner* — Tung S Lau
(74) *Attorney, Agent, or Firm* — Foley & Lardner LLP

(57) ABSTRACT

In an instantaneous voltage drop compensating device, when an instantaneous drop occurs, an electric power transformer (8) performs an inverter action so that the electric power of a side-by-side placed capacitor (7) is DC/AC-converted and fed to a load (3). At this time, a capacitor's remaining lifetime diagnosing unit (100) introduces the DC voltage value, the DC current value, and the temperature value of the side-by-side placed capacitor (7) thereinto, and uses a prestored program for computing a remaining lifetime, thereby diagnosing the remaining lifetime, for which the side-by-side placed capacitor (7) can be used under the state where a capacitor discharge time period exceeds a rated compensation time period. As a result, the remaining lifetime, for which the side-by-side placed capacitor (7) can be used, can be diagnosed under the situations where the discharge time period for the side-by-side placed capacitor (7) to discharge while outputting the rated electric power exceeds the rated compensation time period required as the time period for which an electric power compensating device has to output the rated electric power.

6 Claims, 10 Drawing Sheets

CAPACITOR'S REMAINING LIFETIME DIAGNOSING DEVICE, AND ELECTRIC POWER COMPENSATING DEVICE HAVING THE REMAINING LIFETIME DIAGNOSING DEVICE

TECHNICAL FIELD

The present invention relates to a capacitor's remaining lifetime diagnosing device and an electric power compensating device having the remaining lifetime diagnosing device, the remaining lifetime diagnosing device being capable of taking into account internal resistance or the like of an electric accumulator comprising a capacitor, thereby making a precise diagnosis of capacitor's remaining lifetime for which the electric accumulator can be used.

BACKGROUND ART

As an electric power compensating device having an electric accumulator made of an electric double layer capacitor (EDLC), an instantaneous voltage drop compensating device or an uninterrupted power supply (UPS) is included.

Here, with reference to FIG. 12, an instantaneous voltage drop compensating device using an EDLC as an electric accumulator will be explained.

As shown in FIG. 12, electric power is supplied from a system power source 1 to a load 3 via a high-speed switch 2.

The high-speed switch 2 is in a turned-on state under the control of a control device 4 when the system power source 1 is in a normal state, but if an instantaneous drop occurs in the system power source 1, the high-speed switch 2 is turned off, and when the system power source 1 recovers from the instantaneous drop after the occurrence thereof and returns to the normal state, the high-speed switch 2 is returned to the turn-on state.

The AC current of the system power source 1 is measured by an AC current meter 5 and a measured AC current value is sent to the control device 4, and the AC voltage of the system power source 1 is measured by an AC voltage meter 6 and a measured AC voltage value is sent to the control device 4.

A side-by-side placed capacitor 7 is an electric accumulator comprising EDLCs. More specifically, the configuration of the array board of the side-by-side placed capacitor is such that a plurality of capacitor modules in which 11 EDLCs are connected in parallel with each other are connected, for example, in a three-parallel and three-series configuration via metal conducting wires or conductors.

FIG. 13 shows one example of the side-by-side placed capacitor, where the reference numerals 7a to 7i denote capacitor modules (each in which 11 EDLCs are connected in parallel with each other), the capacitor modules 7a to 7c are connected in parallel with each other, the capacitor modules 7d to 7f are connected in parallel with each other, and the capacitor modules 7g to 7i are connected in parallel with each other.

Then, the group of the capacitor modules 7a to 7c connected in parallel with each other, the group of the capacitor modules 7d to 7f connected in parallel with each other, and the group of the capacitor modules 7g to 7i connected in parallel with each other are connected in series with each other to form a three-parallel and three-series connection array board configuration.

Referring back to FIG. 12 to continue with the explanation, an electric power transformer (converter/inverter) 8 performs a converter action and an inverter action under the control of the control device 4. That is, when the system power source 1 is in the normal state, the electric power transformer 8 performs a converter action to charge the side-by-side placed capacitor 7, when charging is completed, it stops the converter action, and when an instantaneous drop occurs, it performs an inverter action to DC/AC-convert the electric power of the side-by-side placed capacitor 7 and feed it to the load 3.

The DC voltage of the side-by-side placed capacitor 7 is measured by a DC voltage meter 9 and a measured DC voltage value is sent to the control device 4, and DC current outputted from the side-by-side placed capacitor 7 is measured by a DC current meter 10 and a measured DC current value is sent to the control device 4.

Since the side-by-side placed capacitor 7 is not charged at all when the side-by-side placed capacitor 7 has been first installed at a place where it is to be used, or when the side-by-side placed capacitor 7 has been fully discharged for maintenance, a converter 11 and a preparatory charging step-up/down chopper 12 are disposed in order to charge the side-by-side placed capacitor 7, and the converter 11 and the preparatory charging step-up/down chopper 12 are used to preparatorily charge the side-by-side placed capacitor 7.

Incidentally, after preparatory charging is completed, the side-by-side placed capacitor 7 is charged by the electric power transformer 8.

The control device 4 has a preparatory charge control unit 4a, a capacitor control unit 4b, a high-speed switch control unit 4c, and an inverter control unit 4d.

The preparatory charge control unit 4a controls actions of the converter 11 and the preparatory charging step-up/down chopper 12 when preparatory charging is performed, the capacitor control unit 4b controls a charging action of the electric power transformer 8 to the side-by-side placed capacitor 7, the high-speed switch control unit 4c controls an action to turn on/off the high-speed switch 2 according to the occurrence of/recovery from an instantaneous drop, and the inverter control unit 4d performs control for the converter action and the inverter action of the electric power transformer 8.

The example in FIG. 12 has been explained as the instantaneous voltage drop compensating device, but the uninterrupted power supply also has the same basic configuration.

Incidentally, the instantaneous voltage drop compensating device is designed such that the side-by-side placed capacitor 7 can output a rated electric power for a few seconds (a rated compensation time period), and the uninterrupted power supply is designed such that the side-by-side placed capacitor 7 can output a rated electric power for a few minutes (a rated compensation time period).

Since the instantaneous voltage drop compensating device or the uninterrupted power supply thus configured is used for a long time period, it is necessary to diagnose the remaining lifetime of EDLCs.

In order to satisfy such a requirement, a system for measuring/determining the state of a capacitor is disclosed in Japanese Patent No. 3562633 (Patent Literature 1), and systems for predicting the remaining lifetime using capacitance are disclosed in Japanese Patent No. 4011016 (Patent Literature 2) and Japanese Unexamined Patent Application Publication No. 2008-17691 (Patent Literature 3).

PRIOR ART LITERATURE

Patent Literature

Patent Literature 1: Japanese Patent No. 3562633
Patent Literature 2: Japanese Patent No. 4011016

Patent Literature 3: Japanese Unexamined Patent Application Publication No. 2008-17691

SUMMARY OF THE INVENTION

Problem to be Solved by the Invention

In the techniques shown in Patent Literatures 2 and 3 (Japanese Patent No. 4011016 and Japanese Unexamined Patent Application Publication No. 2008-17691), a method for determining the lifetime based upon a capacitance obtained from a result of measurement obtained by a device for measuring voltage, current, and ambient temperature that has been installed in a power supply applied with a capacitor is adopted.

However, an influence of the internal resistance that the capacitor has cannot be evaluated by the method, as a result, the requirement "a predetermined rated electric power or a load's required electric power is outputted only for a predetermined rated compensation time period", which is required as a function of the instantaneous voltage drop compensating device or the uninterrupted power supply, is not satisfied sometimes.

That is, even if a discharge time period for which the capacitor could simply discharge was longer than the rated compensation time period, whether or not "the discharge time period for which the capacitor could discharge while securing the output of the rated electric power or the load required time" was longer than the rated compensation time period could not be determined.

Incidentally, the load's required electric power means electric power consumed by the load (3) and thus means electric power necessary for a load to operate optimally. Therefore, when a load capacity is different from a rated capacity, the load's required electric power and the rated electric power are different from each other (the load's required electric power is smaller than the rated electric power), and when the load capacity is equal to the rated capacity, the load's required electric power and the rated electric power are equal to each other.

In particular, a current value applied to the capacitor is large in the instantaneous voltage drop compensating device, while the internal resistance of the capacitor changes significantly according to the environmental temperature at which the capacitor is used, therefore, an influence of the internal resistance cannot be ignored.

Further, in the technique shown in Patent Literature 1 (Japanese Patent No. 3562633), lifetime estimation is performed from the amount of discharge power, but a case in which an actual load of the amount of power compensated by the device is different from a device rated load (in particular, a case in which the device is operating with a device rated electric power amount or less) cannot be a criterion for determining whether or not the requirement "the predetermined rated electric power is outputted only for the predetermined rated compensation time period" is satisfied.

That is, even if a discharge time period for which the capacitor could simply discharge was longer than the rated compensation time period, whether or not "the discharge time period for which the capacitor could discharge while securing the output of the rated electric power or the load required time" was longer than the rated compensation time period could not be determined.

Furthermore, in the technique shown in Patent Literature 1 (Japanese Patent No. 3562633), an operable time is obtained from an actual load of the amount of electric power that the device should compensate, a capacitance of the electric double layer capacitor, and the degree of deterioration thereof, but, since an influence of the internal resistance is not evaluated, whether or not the power supply performs an action normally cannot precisely be determined.

For a device applied with a capacitor, such as an instantaneous voltage drop compensating device or an uninterrupted power supply, failure to satisfy the requirement "the predetermined rated electric power or load's required electric power is outputted only for the predetermined rated compensation time period (for example, a few seconds preset in the instantaneous voltage drop compensating device and a few minutes predetermined in the uninterrupted power supply)" means that it cannot fulfill its duty as a device, which sometimes becomes a social problem.

In view of the above conventional techniques, an object of the present invention is to provide a capacitor's remaining lifetime diagnosing device which diagnoses a remaining lifetime for which an electric accumulator comprising a capacitor can be used under the situation where a discharge time period for which the electric accumulator can discharge while outputting a rated electric power or a load's required electric power exceeds a rated compensation time period (a time period for which the rated electric power can be outputted) required according to each electric power compensating device, and an electric power compensating device having the remaining lifetime diagnosing device.

Means Adapted to Solve the Problem

A configuration of a capacitor's remaining lifetime diagnosing device of the present invention to solve the above problem lies in a remaining lifetime diagnosing device for diagnosing the remaining lifetime of an electric accumulator comprising an electric double layer capacitor, which is provided in an electric power compensating device, the capacitor's remaining lifetime diagnosing device comprising:

temperature measuring means adapted to measure the temperature of the electric accumulator, voltage measuring means adapted to measure the DC voltage of the electric accumulator, current measuring means adapted to measure DC current outputted by the electric accumulator;

capacitance computing means adapted to compute the capacitance of the electric accumulator, which is obtained when the electric accumulator is in a discharging state, based on the measured voltage measured by the voltage measuring means and the measured current measured by the current measuring means, when the electric accumulator is in the discharging state;

internal resistance computing means adapted to compute the internal resistance of the electric accumulator, which is obtained when the electric accumulator is in the discharging state, based on the measured voltage measured by the voltage measuring means and the measured current measured by the current measuring means, when the electric accumulator is in the discharging state;

discharge time period computing means adapted to compute a discharge time period for which the electric accumulator can discharge while outputting a rated electric power, when the electric accumulator is in the discharging state, based on the capacitance obtained by the capacitance computing means and the internal resistance obtained by the internal resistance computing means; and remaining lifetime computing means adapted to compute a remaining lifetime indicating how much time is left from a time point at which the electric accumulator is put into the discharging state to a time point at which the discharge time period of the electric accumulator becomes less than a rated compensation time period required as a time period for which the electric power compensating device has to output the rated electric power, based on the discharge time period obtained by the discharge time period computing means, the measured temperature obtained by the temperature measuring means, and a prestored remaining lifetime characteristic.

Further, a configuration of the capacitor's remaining lifetime diagnosing device of the present invention lies in that a plurality of remaining lifetime characteristics under a plurality of temperature conditions are stored as the remaining lifetime characteristic in the remaining lifetime computing means; and the remaining lifetime computing means obtains a remaining lifetime characteristic corresponding the measured temperature, from the plurality of remaining lifetime characteristics, when the measured temperature obtained by the temperature measuring means is different from temperatures of the plurality of temperature conditions, and uses the obtained remaining lifetime characteristic to compute the remaining lifetime.

Further, a configuration of a capacitor's remaining lifetime diagnosing device of the present invention lies in a remaining lifetime diagnosing device for diagnosing the remaining lifetime of an electric accumulator comprising an electric double layer capacitor, which is provided in an electric power compensating device, the remaining lifetime diagnosing device comprising:

temperature measuring means adapted to measure the temperature of the electric accumulator, voltage measuring means adapted to measure the DC voltage of the electric accumulator, current measuring means adapted to measure DC current outputted by the electric accumulator;

capacitance computing means adapted to compute the capacitance of the electric accumulator, which is obtained when the electric accumulator is in a discharging state, based on the measured voltage measured by the voltage measuring means and the measured current measured by the current measuring means, when the electric accumulator is in the discharging state;

internal resistance computing means adapted to compute the internal resistance of the electric accumulator, which is obtained when the electric accumulator is in the discharging state, based on the measured voltage measured by the voltage measuring means and the measured current measured by the current measuring means, when the electric accumulator is in the discharging state;

discharge time period computing means adapted to compute a discharge time period for which the electric accumulator can discharge while outputting a rated electric power, based on the capacitance of the electric accumulator and the internal resistance of the electric accumulator; and remaining lifetime computing means adapted to compute a remaining lifetime indicating how much time is left from a time point at which the electric accumulator is put into the discharging state to a time point at which the discharge time period of the electric accumulator becomes less than a rated compensation time period required as a time period for which the electric power compensating device has to output the rated electric power, wherein the remaining lifetime computing means:

prestores therein capacitance change rate characteristics representing a characteristic of the capacitance of the electric accumulator changing with the passage of time for respective temperatures, and internal resistance change rate characteristics representing a characteristic of the internal resistance of the electric accumulator changing with the passage of time for the respective temperature;

obtains a percentage by dividing the discharge time period obtained by the discharge time period computing means by the rated compensation time period, based on the capacitance obtained by the capacitance computing means at the time point at which the electric accumulator is put into the discharging state, the internal resistance obtained by the internal resistance computing means at the time point at which the electric accumulator is put into the discharging state, and the rated electric power;

obtains internal resistances at a plurality of time points different from the time point at which the electric accumulator is put into the discharging state, and at the same temperature as that at the time point at which the electric accumulator is put into the discharging state, from the internal resistance change rate characteristics, obtains capacitances at a plurality of time points different from the time point at which the electric accumulator is put into the discharging state, and at the same temperature as that at the time point at which the electric accumulator is put into the discharging state, from the capacitance change rate characteristics, and obtains percentages for a plurality of time points by dividing the discharge time period for a plurality of time points of time points obtained by the discharge time period computing means by the rated compensation time period, based on the internal resistances and the capacitances for a plurality of time points thus obtained, and the rated electric power; and obtains an extrapolating computation characteristic line by performing extrapolating computation of the respective percentages obtained, obtains a time point at which the extrapolating computation characteristic line reaches 100%, and obtains a time period between the time point at which the extrapolating computation characteristic line reaches 100% and the time point at which the electric accumulator is put into the discharging stage as a remaining life time.

Further, a configuration of the electric power compensating device provided with a remaining lifetime diagnosing device of the present invention lies in that the remaining lifetime diagnosing device is provided in the electric power compensating device; and the voltage measuring means is disposed at a position where the DC voltage of the electric accumulator can be measured when an electric power transformer that inversely transforms the electric power of the electric accumulator at a time of electric power compensation is operating, and the current measuring means is disposed at a position where DC current outputted by the electric accumulator can be measured.

Further, a configuration of the electric power compensating device provided with a remaining lifetime diagnosing device of the present invention lies in that the remaining lifetime diagnosing device is provided in the electric power compensating device;

the electric power compensating device is provided with a resistor, and a chopper that performs a chopper action to discharge the electric power of the electric accumulator and feed the same to the resistor in which the electric power is consumed; and the voltage measuring means is disposed at a position where the DC voltage of the electric accumulator can be measured when the chopper is performing the chopper action, and the current measuring means is disposed at a position where DC current outputted by the electric accumulator can be measured.

Further, a configuration of a capacitor's remaining lifetime diagnosing device lies in a remaining lifetime diagnosing device for diagnosing the remaining lifetime of an electric accumulator comprising an electric double layer capacitor, which is provided in an electric power compensating device, the remaining lifetime diagnosing device comprising:

temperature measuring means adapted to measure the temperature of the electric accumulator, voltage measuring means adapted to measure the DC voltage of the electric accumulator, current measuring means adapted to measure DC current outputted by the electric accumulator, and electric power measuring means adapted to measure a load's required electric power that is an electric power consumed by a load and power-compensated by the electric power compensating device;

capacitance computing means adapted to compute the capacitance of the electric accumulator, which is obtained when the electric accumulator is in a discharging state, based on the measured voltage measured by the voltage measuring means and the measured current measured by the current measuring means, when the electric accumulator is in the discharging state;

internal resistance computing means adapted to compute the internal resistance of the electric accumulator, which is obtained when the electric accumulator is in the discharging state, based on the measured voltage measured by the voltage measuring means and the measured current measured by the current measuring means, when the electric accumulator is in the discharging state;

discharge time period computing means adapted to compute a discharge time period for which the electric accumulator can discharge while outputting the load' required electric power, based on the capacitance of the electric accumulator, the internal resistance of the electric accumulator, and the load's required electric power; and remaining lifetime computing means adapted to compute a remaining lifetime indicating how much time is left from a time point at which the electric accumulator is put into the discharging state to a time point at which the discharge time period of the electric accumulator becomes less than a rated compensation time period required as a time period for which the electric power compensating device has to output the load's required electric power, wherein the remaining lifetime computing means:

prestores capacitance change rate characteristics representing a characteristic of the capacitance of the electric accumulator changing with the passage of time for respective temperatures, and internal resistance change rate characteristics representing a characteristic for different temperature that the internal resistance of the electric accumulator changes with the passage of time for the respective temperatures;

obtains a percentage by dividing the discharge time period obtained by the discharge time period computing means by the rated compensation time period, based on the capacitance obtained by the capacitance computing means at the time point at which the electric accumulator is put into the discharging state, the internal resistance obtained by the internal resistance computing means at the time point at which the electric accumulator is put into the discharging state, and the load's required electric power obtained by the electric power measuring means;

obtains internal resistances at a plurality of time points different from the time point at which the electric accumulator is put into the discharging state, and at the same temperature as that at the time point at which the electric accumulator is put into the discharging state, from the internal resistance change rate characteristic, obtains capacitances at a plurality of time points different from the time point at which the electric accumulator is put into the discharging state, and at the same temperature as that at the time point at which the electric accumulator is put into the discharging state, from the capacitance change rate characteristics, and obtains percentages for a plurality of time points by dividing the discharge time periods for a plurality of time points obtained by the discharge time period computing means by the rated compensation time period, based on the internal resistances and the capacitances for a plurality of time points thus obtained and the load's required electric power obtained by the electric power measuring means; and obtains an extrapolating computation characteristic line by performing extrapolating computation of the respective percentages obtained, obtains a time point at which the extrapolating computation characteristic line reaches 100%, and obtains a time period between the time point at which the extrapolating computation characteristic line reaches 100% and the time point at which the electric accumulator is put into the discharging stage as a remaining life time.

Effect of the Invention

According to the present invention, the remaining lifetime, for which an electric accumulator comprising an electric double layer capacitor (a side-by-side placed capacitor) can be used in the situation where a discharge time period for which the electric accumulator can discharge while outputting a rated electric power or a load's required electric power exceeds a rated compensation time period required according to each electric power compensating device, can accurately be diagnosed.

Therefore, it becomes possible to prevent such a failure that the time period, for which the rated electric power or the load's required electric power can be discharged, does not reach the rated compensation time period.

EMBODIMENTS FOR CARRYING OUT THE INVENTION

Hereinafter, embodiments of the present invention will be explained in detail based on examples.

First Example

Figure 1:
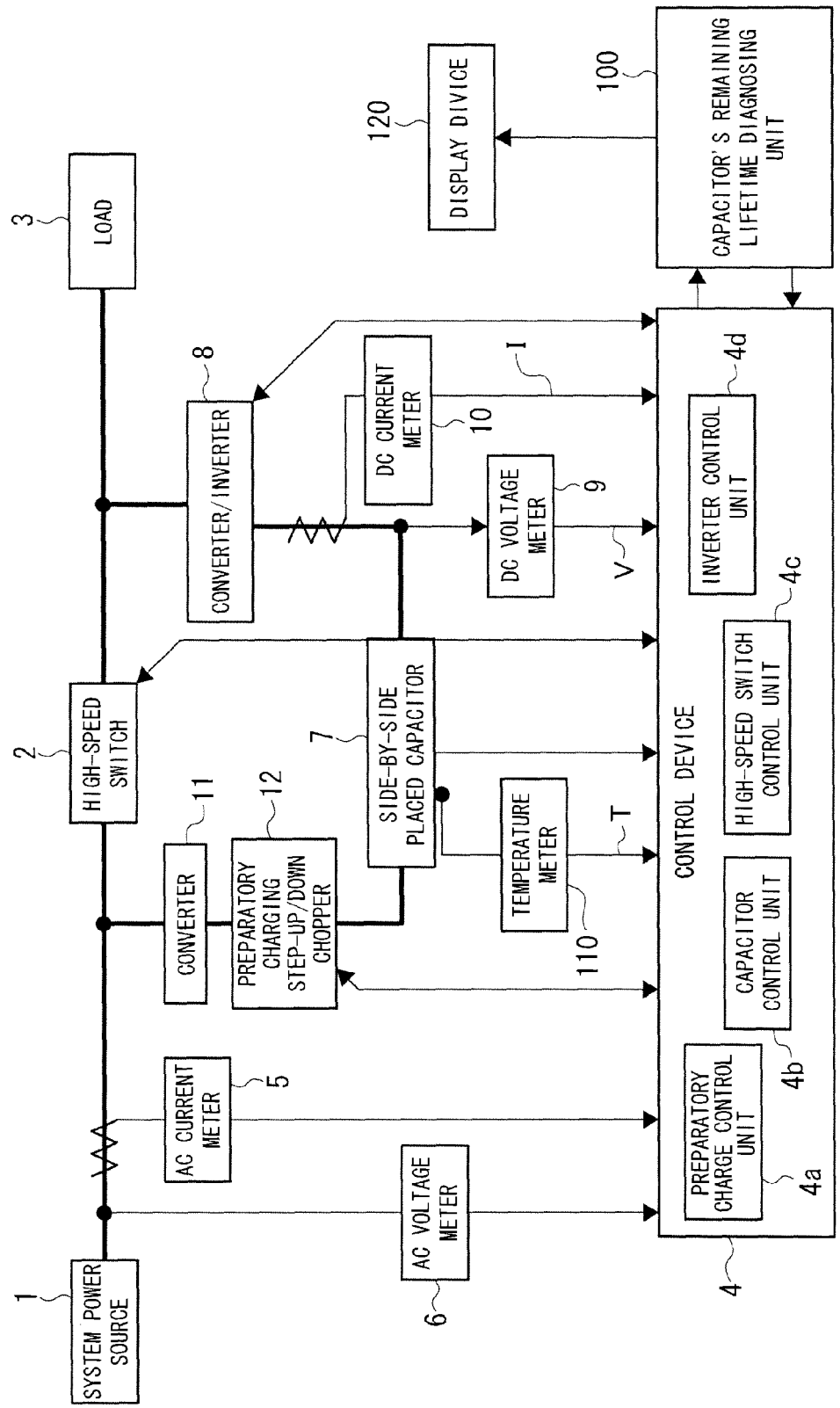
FIG. 1 is a configuration diagram showing an electric power compensating device having a remaining lifetime diagnosing device according to a first example of the present invention.
Figure 12:
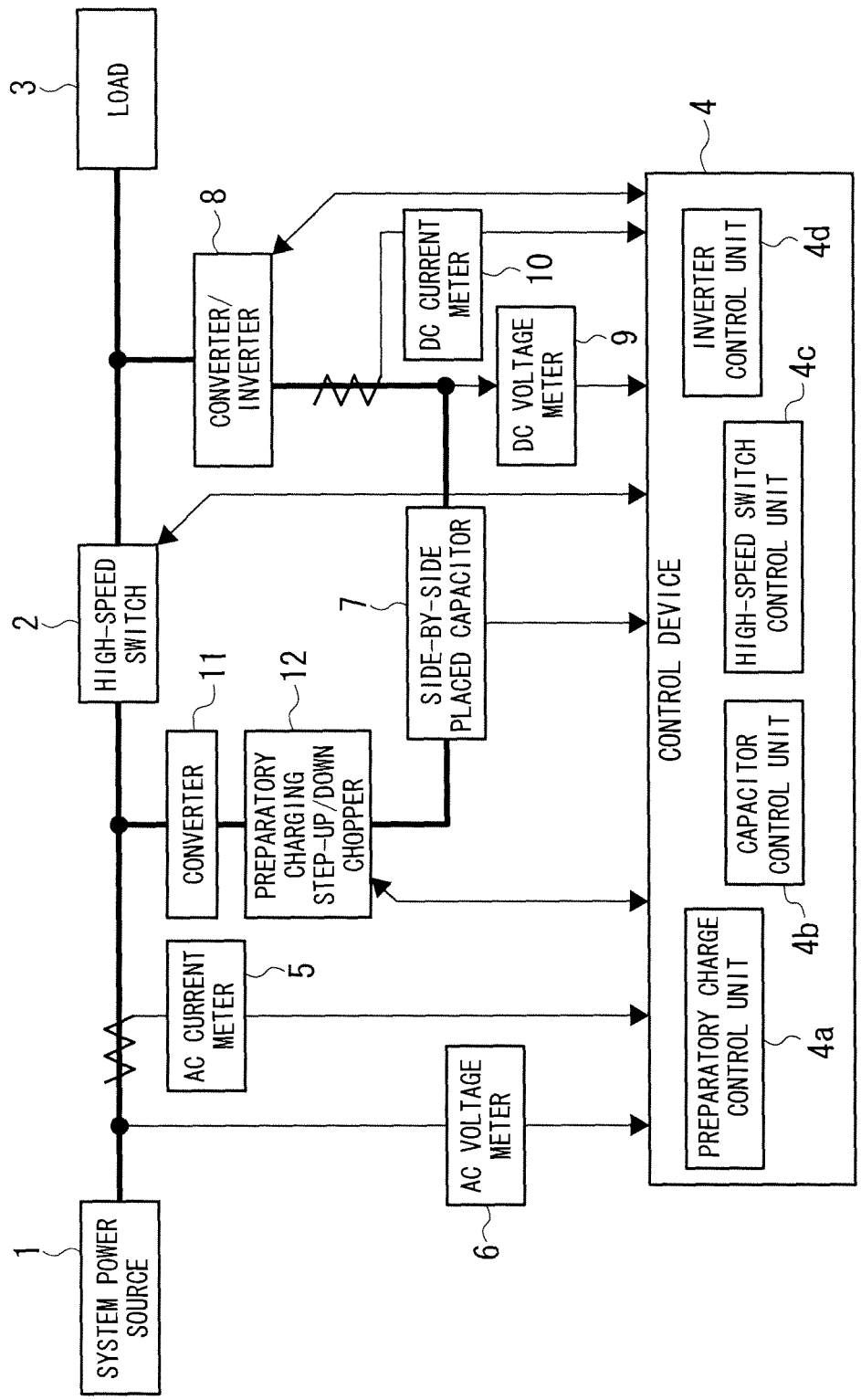
FIG. 12 is a configuration diagram showing an electric power compensating device.
Figure 13:
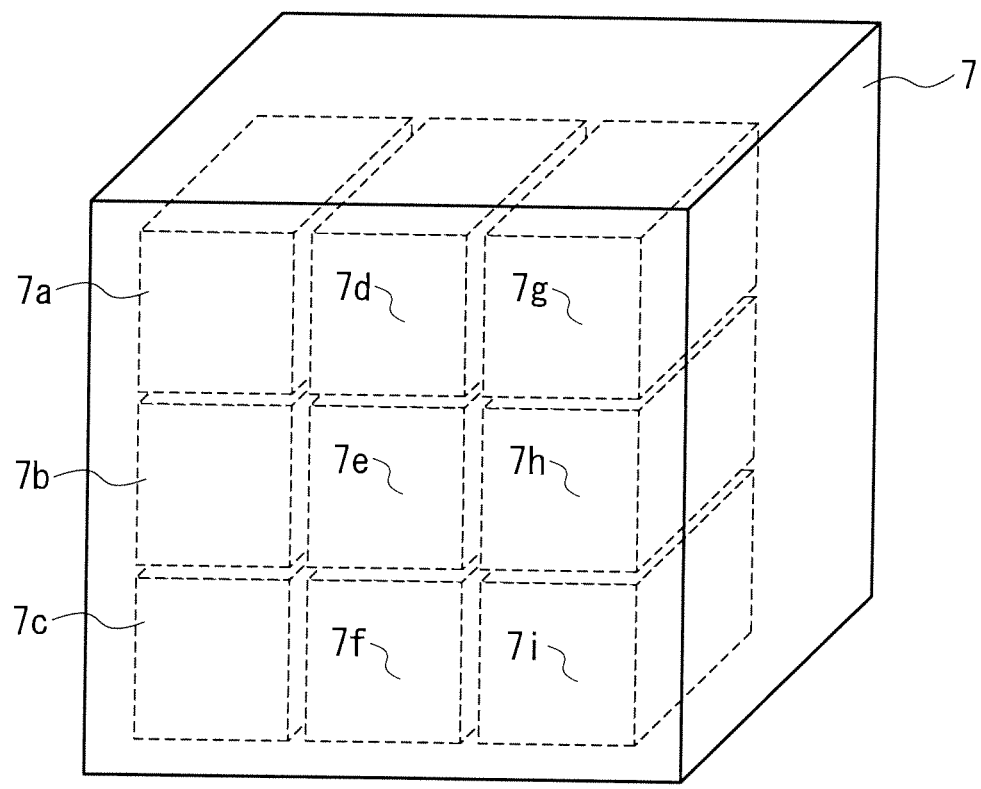
FIG. 13 is a configuration diagram showing a side-by-side placed capacitor.

FIG. 1 shows an instantaneous voltage drop compensating device having a remaining lifetime diagnosing device according to a first example of the present invention. Incidentally, components of the instantaneous voltage drop compensating device having the same functions as components of the instantaneous voltage drop compensating device shown in FIG. 12 are assigned with the same reference numerals as the latter components, thereby omitting repetitive explanation.

In the first example, the instantaneous voltage drop compensating device is provided with a capacitor's remaining lifetime diagnosing unit 100, a temperature meter 110, and a display device 120 as components of the remaining lifetime diagnosing device.

Further, a DC voltage meter 9 and a DC current meter 10 that are originally provided in the instantaneous voltage drop compensating device are diverted to components of the remaining lifetime diagnosing device. As the DC current meter 10, a clamp meter for current measurement having a high response speed is preferably used.

The temperature meter 110 measures the temperature of any one of capacitor modules in a side-by-side placed capacitor 7, and a temperature signal T representing a measured temperature value is sent to the capacitor's remaining lifetime diagnosing unit 100 via a control device 4. A portion on which the temperature meter 110 should be disposed is set at a place where it does not impair electrical insulation of the capacitor modules.

The DC voltage meter 9 measures DC voltage of the side-by-side placed capacitor 7, and a voltage signal V representing a measured DC voltage value is sent to the capacitor's remaining lifetime diagnosing unit 100 via the control device 4.

The DC current meter 10 measures discharge current outputted from the side-by-side placed capacitor 7, and a current signal I representing a measured DC current value is sent to the capacitor's remaining lifetime diagnosing unit 100 via the control device 4.

Figure 2:
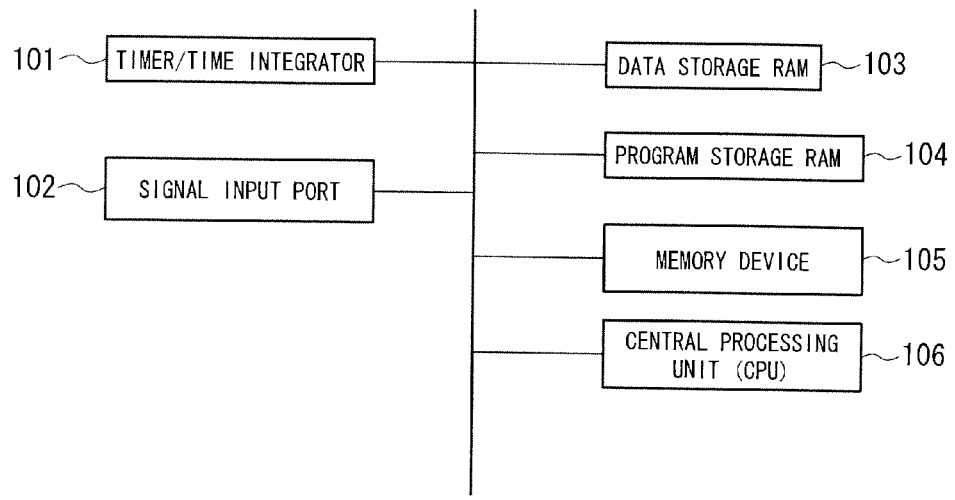
FIG. 2 is a functional block diagram showing a capacitor's remaining lifetime diagnosing unit.

FIG. 2 is a functional block diagram showing the configuration of the capacitor's remaining lifetime diagnosing unit 100. As shown in FIG. 2, the capacitor's remaining lifetime diagnosing unit 100 has a timer/time integrator 101, a signal input port 102, a data storage RAM 103, a program storage RAM 104, a memory device 105, and a central processing unit (CPU) 106.

The timer/time integrator 101 has a function as a system timer and a function to measure an action time of the side-by-side placed capacitor 7. The "action time" means a time period started from a time point at which charging of the side-by-side placed capacitor 7 is completed and the electric power compensating device (the instantaneous voltage drop compensating device in this example) is put into an operable state.

The temperature signal T, the voltage signal V, and the current signal I are inputted in the capacitor's remaining lifetime diagnosing unit 100 via the signal input port 102.

The data storage RAM 103 is used to store measurement data or as a work area for the CPU 106.

Figure 3:
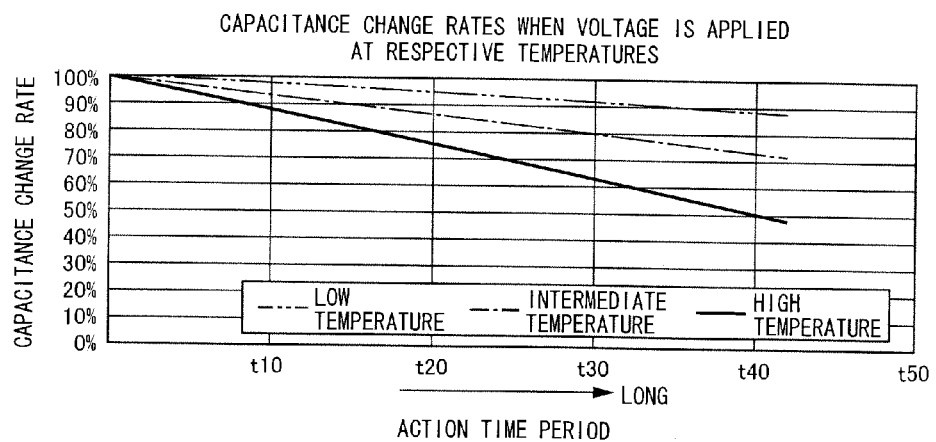
FIG. 3 is a characteristic graph showing time change characteristics of capacitance change rates.
Figure 4:
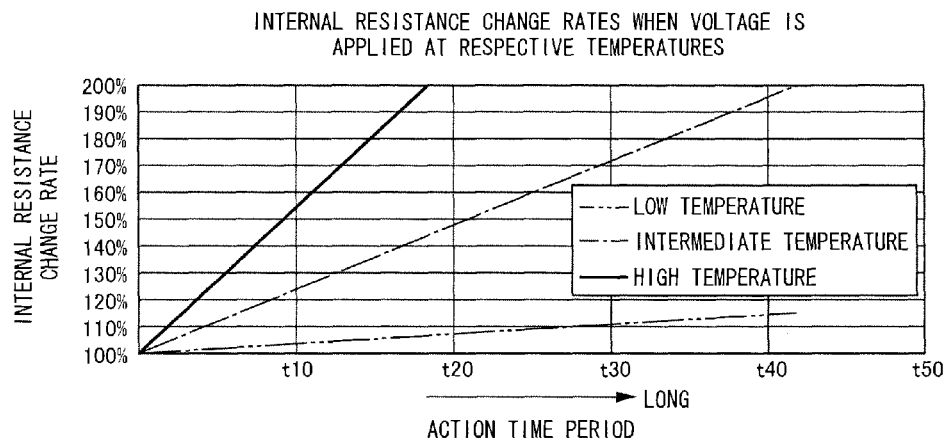
FIG. 4 is a characteristic graph showing time change characteristics of internal resistance change rates.
Figure 5:
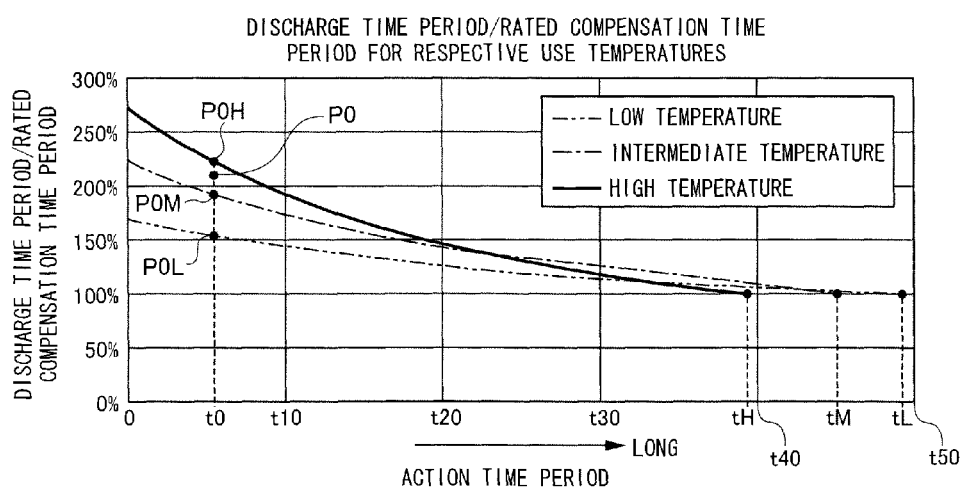
FIG. 5 is a characteristic graph showing time change characteristics of "discharge time period/rated compensation time period"

The program storage RAM 104A stores computing programs that cause the CPU 106 to perform predetermined computing actions. As the computing programs, there are programs such as described below.
(1) Capacitance computing program
(2) Internal resistance computing program
(3) Discharge time period computing program
(4) Remaining lifetime diagnosis program The memory device 105 stores therein characteristics showing capacitance change rates of the side-by-side placed capacitor 7 obtained when voltage application has been performed at respective temperatures, such as shown in FIG. 3, internal resistance change rates of the side-by-side placed capacitor 7 obtained when voltage application has been performed at respective temperatures, such as shown in FIG. 4, and characteristics showing discharge time periods/rated compensation time periods of the side-by-side placed capacitor 7 for respective use temperatures, such as shown in FIG. 5. The characteristics shown in FIGS. 3 to 5 are obtained from preliminary measurement.

Further, in FIGS. 3 to 5, the high temperature is for example 60° C., the intermediate temperature is for example 30° C., the low temperature is for example 10° C., and the horizontal axis indicates a voltage application time period and corresponds to the aforementioned action time period.

In illustration of the characteristics shown in FIG. 3, the horizontal axis indicates a time period, and the characteristics show that, when a capacitor temperature is set at a high temperature, an intermediate temperature, and a low temperature in a state where the side-by-side placed capacitor 7 has been floating-charged, the capacitances of the side-by-side placed capacitor 7 at the respective temperatures change with the passage of time. From the characteristics in FIG. 3, it can be found that, the higher the capacitor temperature is, and the more time elapses, the further the capacitance decreases.

In illustration of the characteristics of FIG. 4, the horizontal axis indicates a time period, and the characteristics show that, when the capacitor temperature is set at a high temperature, an intermediate temperature, and a low temperature in a state where the side-by-side placed capacitor 7 has been floating-charged, the internal resistances of the side-by-side placed capacitor 7 at the respective temperatures change with the passage of time. From the characteristics in FIG. 4, it can be found that, the higher the capacitor temperature is, and the more time elapses, the further the internal resistance increases.

In illustration of the characteristics of FIG. 5, the horizontal axis indicates a time period, and the vertical axis indicates "discharge time period/rated compensation time period". The characteristics in FIG. 5 are characteristics showing that, when the capacitor temperature is set at respective temperatures (a high temperature, an intermediate temperature, a low temperature), the "discharge time period/rated compensation time period" of the side-by-side placed capacitor 7 when compensating action is performed at a normal frequency change with the passage of time.

Here, the "rated compensation time period" that is the denominator of the vertical axis in FIG. 5 means a time period required as the time period for which an electric accumulator (side-by-side placed capacitor 7) has to discharge while outputting a predetermined rated electric power or load's required electric power such that the electric power compensating device (the instantaneous voltage drop compensating device in this example) can perform an electric power compensating (instantaneous drop compensating) action without fail.

Further, the "discharge time period" that is the numerator of the vertical axis in FIG. 5 does not mean a time period for which the side-by-side placed capacitor 7 can simply discharge but means a time period for which the side-by-side placed capacitor 7 can discharge while outputting the rated electric power or the load's required electric power.

In the characteristics of FIG. 5, the fact that the "discharge time period/rated compensation time period" fall below 100% means the end of an electric accumulator's (side-by-side placed capacitor 7) lifetime.

That is, when the "discharge time period/rated compensation time period" becomes less than 100%, the electric accumulator can discharge but output the rated electric power or the load's required electric power only for less than the rated compensation time period, therefore, when the electric accumulator is put into such a state, it is determined in this example that the electric accumulator has reached the end of its lifetime.

When such a remaining lifetime diagnosing device is in a normal state in which no instantaneous drop occurs in the system power source 1, the capacitor's remaining lifetime diagnosing unit 100 introduces (samples) the temperature signals T, the voltage signals V, and the current signals I thereinto and stores them in the data storage RAM 103 at intervals of 10 to 30 minutes.

When an instantaneous drop occurs in the system power source 1, the high-speed switch 2 is turned off by the control device 4, and the electric power transformer 8 starts an inverter action so that the electric power of the side-by-side placed capacitor 7 is fed to the load 3. That is, the side-by-side placed capacitor 7 performs a discharging action.

Figure 6:
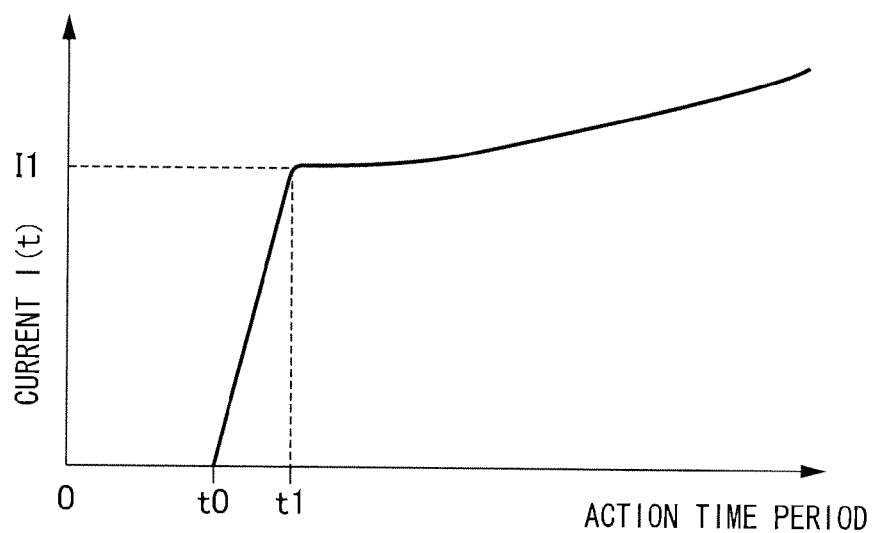
FIG. 6 is a characteristic graph showing a current characteristic outputted from a side-by-side placed capacitor at electric power compensating time.
Figure 7:
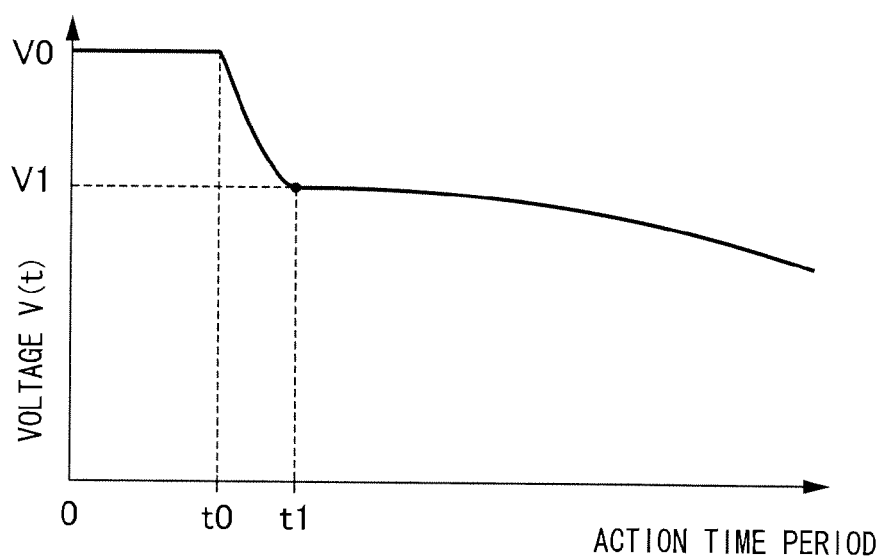
FIG. 7 is a characteristic graph showing a voltage characteristic of the side-by-side placed capacitor at electric power compensating time.

A characteristic of current outputted from the side-by-side placed capacitor 7 when the instantaneous voltage drop compensating device starts an instantaneous drop compensating action and the side-by-side placed capacitor 7 starts a constant power discharging action is as shown in FIG. 6, and a characteristic of voltage of the side-by-side placed capacitor 7 is as shown in FIG. 7.

In FIGS. 6 and 7, a time point t0 represents a time point from which the instantaneous drop compensating action has been started, and, from this time point t0, the electric power transformer 8 starts a converter action and discharging from the side-by-side placed capacitor 7 is started. At a time point t1 and thereafter, the side-by-side placed capacitor 7 is put into a constant power discharging state.

In FIG. 7, a voltage V0 at the time point t0 is a voltage when the side-by-side placed capacitor 7 does not output current, namely, a voltage obtained when there is no influence of the internal resistance. Further, a voltage V1 at the time point t1 is a voltage reduced corresponding to voltage drop due to the internal resistance, since the side-by-side placed capacitor 7 is outputting rated current.

At the time point t0 from which the instantaneous drop occurs and the instantaneous drop compensating action is started by the instantaneous voltage drop compensating device and thereafter, the capacitor's remaining lifetime diagnosing unit 100 shortens a sampling period to 20 msec or less, and introduces the temperature signal T, the voltage signal V, and the current signal I thereinto every sampling period, and stores the temperature signal T, the voltage signal V, and the current signal I at each time point (for each sampling period) in time series in the data storage RAM 103.

A characteristic curve obtained from the current signals I stored in time series in the data storage RAM 103 is shown in FIG. 6, and a characteristic curve obtained from the voltage signals V stored in time series in the data storage RAM 103 is shown in FIG. 7.

After the characteristic curves shown in FIGS. 6 and 7 are obtained, the CPU 106 performs computing actions of respective steps described below.

[Step for Obtaining Capacitance and Internal Resistance]

The CPU 106 reads the "capacitance computing program" from the program storage RAM 104, and, according to this capacitance computing program, it obtains a capacitance C of the side-by-side placed capacitor 7 by the following computing.

That is, voltage signals V(t) and current signals I(t) that have been sampled momentarily at the time point t0 and thereafter are applied to the following equation.

$$C \int I(t)dt = \int (dV(t)/dt)dt$$

In this case, an integral range is set, for example, to a range from the time point t0 to a time point at which the instantaneous drop compensating action has been completed. Then, by solving the above equation, the capacitance C of the side-by-side placed capacitor 7 when this instantaneous drop has occurred is obtained.

The CPU 106 reads the "internal resistance computing program" from the program storage RAM 104, and, according to this internal resistance computing program, it obtains an internal resistance R of the side-by-side placed capacitor 7 by the following computing.

That is, a current I1 at the time point t1 and a voltage V1 at the time point t1 are applied to the following equation to obtain the internal resistance R when this instantaneous drop has occurred.

$$R = V1/I1$$

Incidentally, in this example, the current I1 and the voltage V1 at the time point t1 are used, but a time point included in the time point t1 or thereafter, namely, a time point included in a time period where constant power discharging becomes possible may be adopted instead of the time point t1. The time point at which the current and the voltage are introduced in this manner (a time point from which constant power discharging becomes possible, for example, t1) is preset according to a characteristic of the electric power compensating device to which the side-by-side placed capacitor 7 is applied.

[Step for Obtaining a Discharge Time Period]

The CPU 106 reads the "discharge time period computing program" from the program storage RAM 104, the capacitance C of the side-by-side placed capacitor 7 obtained by using the capacitance computing program described above and the internal resistance R obtained by using the internal resistance computing program described above are applied to the discharge time period computing program to obtain a discharge time period of the side-by-side placed capacitor 7 when this instantaneous drop has occurred.

As described above, the "discharge time period" used here does not means a time period for which the side-by-side placed capacitor 7 can simply discharge but means a time period for which the side-by-side placed capacitor 7 can discharge while outputting the rated electric power or the load's required electric power.

As the discharge time period computing program (discharge time period computing equation), various programs (computing equations) have already been known, for example, a computing program shown in the literature "The 12th international seminar double layers capacitor and similar energy storage devices, Dec. 9. 11 (2002): Michio Okamura" is used to obtain the discharge time period of the side-by-side placed capacitor 7.

One example of the discharge time period computing equation shown in the above literature is as follows.

$$t=(3C/8W)v_0^2-CR\{¼+RW/8v_0^2+2\text{Inv}_0+\text{In}2-\text{In}(v_0^2+RW)\} \quad (1)$$

Incidentally, this discharge time period computing equation (1) assumes that a discharge cutoff voltage of the capacitor is (½) $v_o$, t represents a discharge time period for which the rated electric power can be discharged, C represents a capacitance (F), R represents an internal resistance (Ω), W represents an output electric power (W), and v represents a voltage (V).

As the electric power W, the rated electric power or the load's required electric power is used.

Incidentally, a database for obtaining the discharge time period by using the capacitance C, the internal resistance R, and an average temperature obtained from temperature history of the temperature signals T as parameters may be preset so that the discharge time period is obtained based upon this database.

[Step for Diagnosing Remaining Lifetime (First Method)]

The CPU 106 reads "a first program for diagnosing a remaining lifetime" from the program storage RAM 104, and, according to this first program for estimating the remaining lifetime, it performs the following computing, utilizing the three characteristic curves in FIG. 5, and estimates the remaining lifetime of the side-by-side placed capacitor 7.

That is, a percentage P0 [%] is obtained by dividing the discharge time period at the time point t0 where the instantaneous drop has occurred, which has been obtained by the discharge time period computing program described above, by the rated compensation time period.

Further, the temperature at the time point t0 where the instantaneous drop has occurred is determined. Here, for example, when the temperature is the high temperature (60° C.), a percentage P0H [%] at the time point t0 on the characteristic curve for the high temperature is obtained from the characteristics in FIG. 5.

Incidentally, as the temperature at the time point t0, the average temperature obtained from temperature history of the temperature signals T is adopted.

When the average temperature is 60° C., assuming that the remaining lifetime is represented by X, the following relational expression is established from the characteristics in FIG. 5.

$$P0H/P0=(tH-to)/X \quad (2)$$

From this expression, the remaining lifetime X is obtained.

The above relational expression can be applied when the characteristics shown in FIG. 5 is approximately linear.

Further, when the temperature at the time point t0 where the instantaneous drop has occurred is the intermediate temperature (30° C.), a percentage P0M [%] at the time point t0 on the characteristic curve for the intermediate temperature is obtained from the characteristics in FIG. 5.

Incidentally, as the temperature at the time point t0, the average temperature obtained from temperature history of the temperature signals T is adopted.

When the average temperature is 30° C., assuming that the remaining lifetime is represented by X, the following relational expression is established from the characteristics in FIG. 5:

$$P0M/P0=(tM-to)/X \quad (3)$$

From the expression, the remaining lifetime X is obtained.

The above relational expression can be applied when the characteristic shown in FIG. 5 is approximately linear.

Further, when the temperature at the time point t0 where the instantaneous drop has occurred is the low temperature (10° C.), a percentage P0L [%] at the time point t0 on the characteristic curve for the low temperature is obtained from the characteristics of FIG. 5.

Incidentally, as the temperature at the time point t0, the average temperature obtained from temperature history of the temperature signals T is adopted.

When the average temperature is 10° C., assuming that the remaining lifetime is represented by X, the following relational expression is established from the characteristics in FIG. 5:

$$P0L=(tL-to)/X \quad (4)$$

From the expression, the remaining lifetime X is obtained.

The above relational expression can be applied when the characteristic shown in FIG. 5 is approximately linear.

Incidentally, in the characteristic graph of FIG. 5, there are only the characteristic curve at the high temperature (60° C.), the characteristic curve at the intermediate temperature (30° C.), and the characteristic curve at the low temperature (10° C.), but, when the temperature at which the instantaneous drop has occurred is a temperature (for example, 40° C.) other than the above high temperature (60° C.), intermediate temperature (30° C.), and low temperature (10° C.), a regression equation with respect to three characteristic curves of the high temperature (60° C.), the intermediate temperature (30° C.), and the low temperature (10° C.) is obtained by the method of least squares or the like, and a characteristic curve at, for example, 40° C. is obtained by using this regression equation.

Then, the characteristic curve at, for example, 40° C. is used to perform similar computing to the aforementioned expressions (2), (3), and (4) to obtain the remaining lifetime X.

The remaining lifetime X obtained at the capacitor's remaining lifetime diagnosing unit 100 is displayed on the display device 120.

Incidentally, when the remaining lifetime X obtained does not reach a guaranteed lifetime period of the instantaneous voltage drop compensating device, or when the percentage (=discharge time period/rated compensation time period) P0 [%] obtained when this instantaneous drop has occurred is less than 100%, a warning can be issued.

[Step for Diagnosing Remaining Lifetime (Second Method)]

As the method for diagnosing a remaining lifetime, a second method explained next as well as the first method described above can be used.

The CPU 106 reads "a second program for diagnosing a remaining lifetime" from the program storage RAM 104.

In this instance, the explanation is made on the assumption that the temperature detected when the instantaneous drop has occurred is, for example, the high temperature (60° C.). Incidentally, as the temperature detected when the instantaneous drop has occurred, the average temperature obtained from temperature history of the temperature signals T is adopted.

Figure 8:
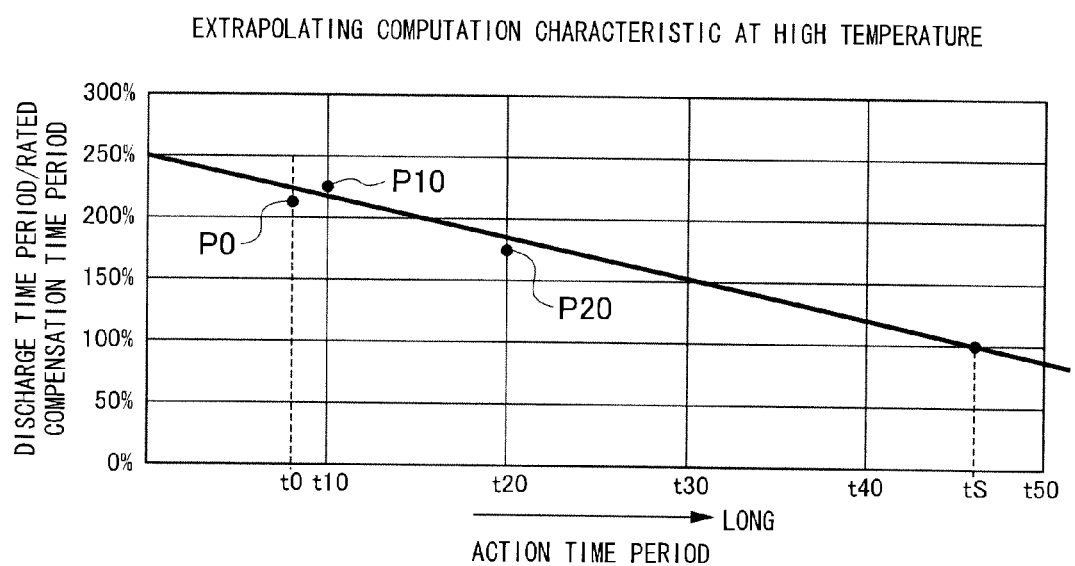
FIG. 8 is a characteristic graph showing a characteristic of "discharge time period/rated compensation time period" obtained by performing extrapolating computation.

First, a percentage P0 [%] is obtained by dividing the discharge time period at the time point t0 at which the instantaneous drop has occurred, which is obtained by the discharge time period computing program described above, by the rated compensation time period. The percentage P0 [%] at the time point t0 is plotted as shown in FIG. 8.

In this instance, when the discharge time period is obtained according to the aforementioned discharge time computing equation (1), the rated electric power is used as the electric power W.

Next, a capacitance C10 at a time point different from the time point t0, for example, a time point t10, is obtained from one of the characteristics shown in FIG. 3 that corresponds to the temperature at an occurrence time of this instantaneous drop (for example, the high temperature, 60° C.). Further, an internal resistance R10 at the time point t10 is obtained from one of the characteristics shown in FIG. 4 that corresponds to the temperature at the occurrence time of this instantaneous drop (for example, the high temperature, 60° C.).

Next, the capacitance C10 and the internal resistance R10 are applied to the aforementioned discharge time period computing program to predict the discharge time period of the side-by-side placed capacitor 7 at the time point t10.

In this instance, when the discharge time period is obtained according to the aforementioned discharge time period computing equation (1), the rated electric power is used as the electric power W.

Then, a percentage P10 [%] is obtained by dividing the discharge time period at the time point t10 (a predicted discharge time period) by the rated compensation time period, and the percentage P10 [%] at the time point t10 is plotted as shown in FIG. 8.

Next, a capacitance C20 at a time point different from the time points t0 and t10, for example, a time point t20, is obtained from one of the characteristics shown in FIG. 3 that corresponds to the temperature at an occurrence time of this instantaneous drop (for example, the high temperature, 60° C.). Further, an internal resistance R20 at the time point t20 is obtained from one of the characteristics shown in FIG. 4 that corresponds to the temperature at the occurrence time of this instantaneous drop (for example, the high temperature, 60° C.).

Next, the capacitance C20 and the internal resistance R20 are applied to the aforementioned discharge time period computing program to predict the discharge time period of the side-by-side placed capacitor 7 at the time point t20.

In this instance, when the discharge time period is obtained according to the aforementioned discharge time period computing equation (1), the rated electric power is used as the electric power W.

Then, a percentage P20 [%] is obtained by dividing the discharge time period at the time point t20 (predicted discharge time period) by the rated compensation time period, and the percentage P20 [%] at the time point t20 is plotted as shown in FIG. 8.

In this manner, the percentages P0 [%], P10 [%], and P20 [%] at least three time points (in this instance, the time points t0, t10, and t20) are plotted.

Incidentally, in order to further improve accuracy, a percentage at a time point other than t0, t10, and t20 is additionally plotted.

Then, an extrapolating computation characteristic line such as shown in FIG. 8 is obtained by performing extrapolating computation of the plotted percentages P0 [%], P10 [%], and P20 [%].

Since the time point at which this extrapolating computation characteristic line reaches 100% is ts, the capacitor's remaining lifetime diagnosing unit 100 makes a diagnosis indicating that the remaining lifetime X from the time point t0 is (ts−t0).

Incidentally, in the above explanation, the case in which the temperature when the instantaneous drop has occurred (the average temperature obtained from temperature history of the temperature signals T) is the high temperature (60° C.) is taken as an example to make an explanation, but, when the temperature when the instantaneous drop has occurred is the intermediate temperature or the low temperature, the capacitance and the internal resistance at the intermediate temperature or the low temperature are obtained by using the characteristics at the intermediate temperature or the low temperature shown in FIGS. 4 and 5.

Further, only the temperature characteristics at three types of temperatures (the high temperature, the intermediate temperature, and the low temperature) are shown in FIGS. 4 and 5, but, when the temperature at the occurrence time of the instantaneous drop is another temperature, a regression equation with respect to three characteristic curves is obtained by the method of least squares or the like, and a characteristic curve at the temperature is obtained by using this regression equation.

Then, the characteristic thus obtained is utilized to obtain the capacitance and the internal resistance at the temperature.

The remaining lifetime X obtained at the capacitor's remaining lifetime diagnosing unit 100 is displayed on the display device 120.

Incidentally, when the remaining lifetime X obtained does not reach a guaranteed lifetime period of the instantaneous voltage drop compensating device, or when the percentage (=the discharge time period/rated compensation time period) P0 [%] obtained when this instantaneous drop has occurred is less than 100%, a warning can be issued.

Second Example

In the first example described above, the remaining lifetime is diagnosed by measuring the DC voltage, the DC current, and the temperature of the side-by-side placed capacitor 7 when the electric power transformer 8 performs a converter action and the side-by-side placed capacitor 7 discharges (performs constant power discharge) to feed electric power to the load 3 in order to perform an electric power compensating action (an instantaneous drop compensating action or an electric power interruption compensating action).

On the other hand, in a second example, the remaining lifetime is diagnosed by measuring the DC voltage, the DC current, and the temperature of the side-by-side placed capacitor 7 when the side-by-side placed capacitor 7 discharges in a maintenance mode.

Figure 9:
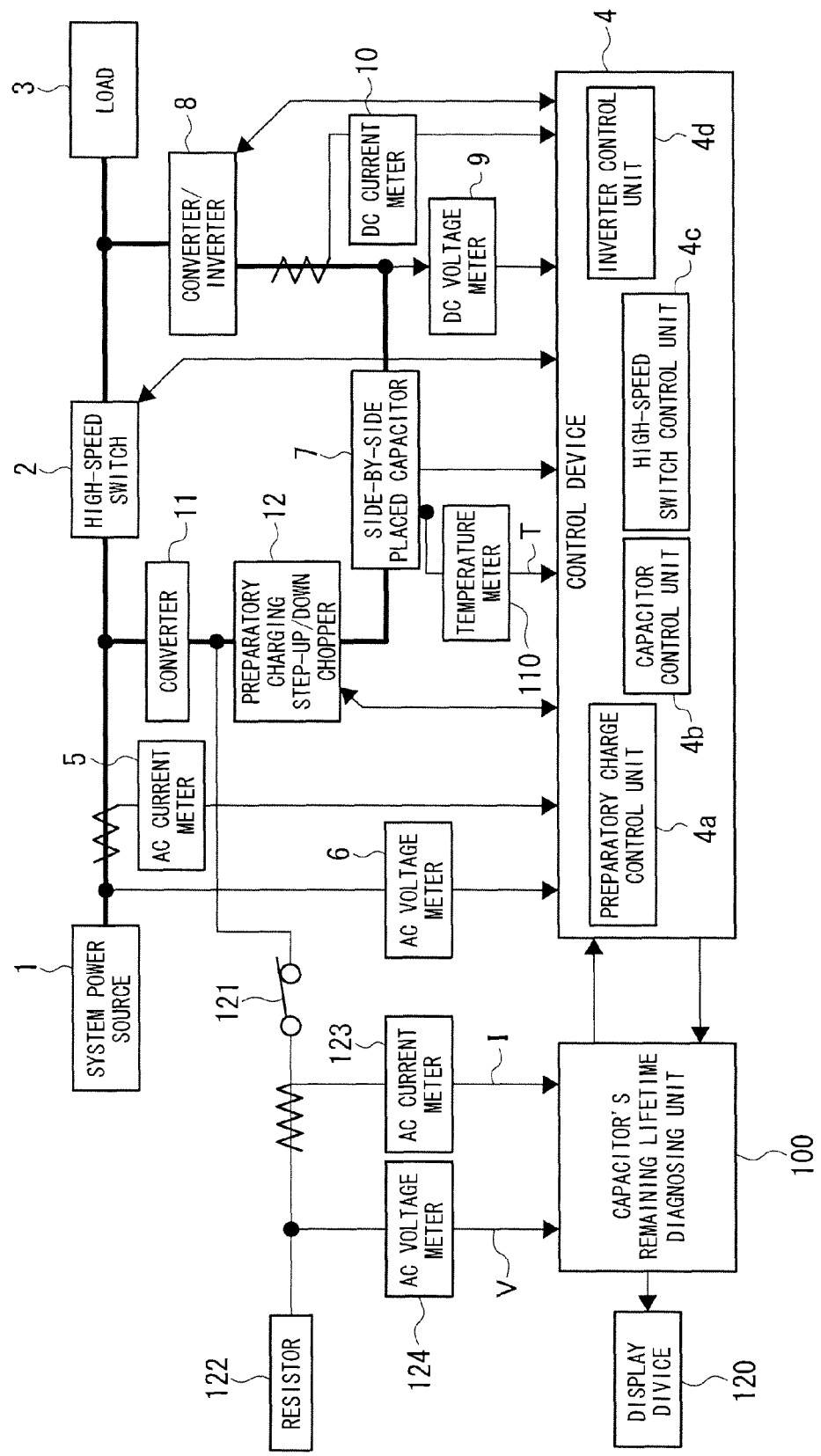
FIG. 9 is a configuration diagram showing an electric power compensating device having a remaining lifetime diagnosing device according to a second example of the present invention.

As shown in FIG. 9, a resistor 122 is connected to the output of the preparatory charging step-up/down chopper 12 via a bypass switch 121. A conducting wire that connects the bypass switch 121 and the resistor 122 to each other is provided with a DC current meter 123 and a DC voltage meter 124.

In the maintenance mode, the electric power transformer 8 and the converter 11 are put into a halting state, the bypass switch 121 is turned on, and the preparatory charging step-up/down chopper 12 is caused to operate in a constant current discharge mode.

Therefore, constant current is discharged from the side-by-side placed capacitor 7, the discharged current is consumed at the resistor 122, and finally the side-by-side placed capacitor 7 is put into a fully discharged state.

When the side-by-side placed capacitor 7 is discharged in the maintenance mode in this manner, the DC current meter 123 measures the discharged current outputted from the side-by-side placed capacitor 7, and sends a current signal I representing a measured DC current value to the capacitor's remaining lifetime diagnosing unit 100.

Further, the DC voltage meter 124 measures the DV voltage of the side-by-side placed capacitor 7, and sends a voltage signal V representing a measured DC voltage value to the capacitor's remaining lifetime diagnosing unit 100.

Furthermore, the temperature meter 110 measures the temperature of the side-by-side placed capacitor 7, and sends a temperature signal T representing a measured temperature value to the capacitor's remaining lifetime diagnosing unit 100 via the control device 4.

The remaining lifetime diagnosing unit 100 introduces the DC current signal I, the DC voltage V, and the temperature signal T thereinto in a similar manner to the first example, and performs computation according to the respective computing programs to obtain the capacitance and the internal resistance, then obtain the discharge time period, and finally obtain the remaining lifetime, thereby diagnosing the remaining lifetime of the capacitor 7. The result obtained by the diagnosis is displayed on the display unit 120.

Third Example

Next, a third example of the present invention will be explained.

In the step 2 (second) method for diagnosing a remaining lifetime of the first example described above, when the discharge time period is obtained according to the discharge time period computing equation (1), the rated electric power is used as the electric power W, but, in the third example, the load's required electric power is used as the electric power W.

Actual power consumption at the load fluctuates according to increase of load on the downstream side due to expansion of facilities or change in loading configuration (increase of capacitive load (a rectifier) or increase of inductive load (a motor or the like)).

Therefore, it is important to make an accurate diagnosis of the remaining lifetime for which the electric power compensating device can compensate for such an actual load.

In the third example, the remaining lifetime in the situation where the discharge time period for which the electric accumulator can output electric power consumed by the actual load and power-compensated by the electric power compensating device (load's required electric power) exceeds the rated compensation time period is diagnosed.

Figure 10:
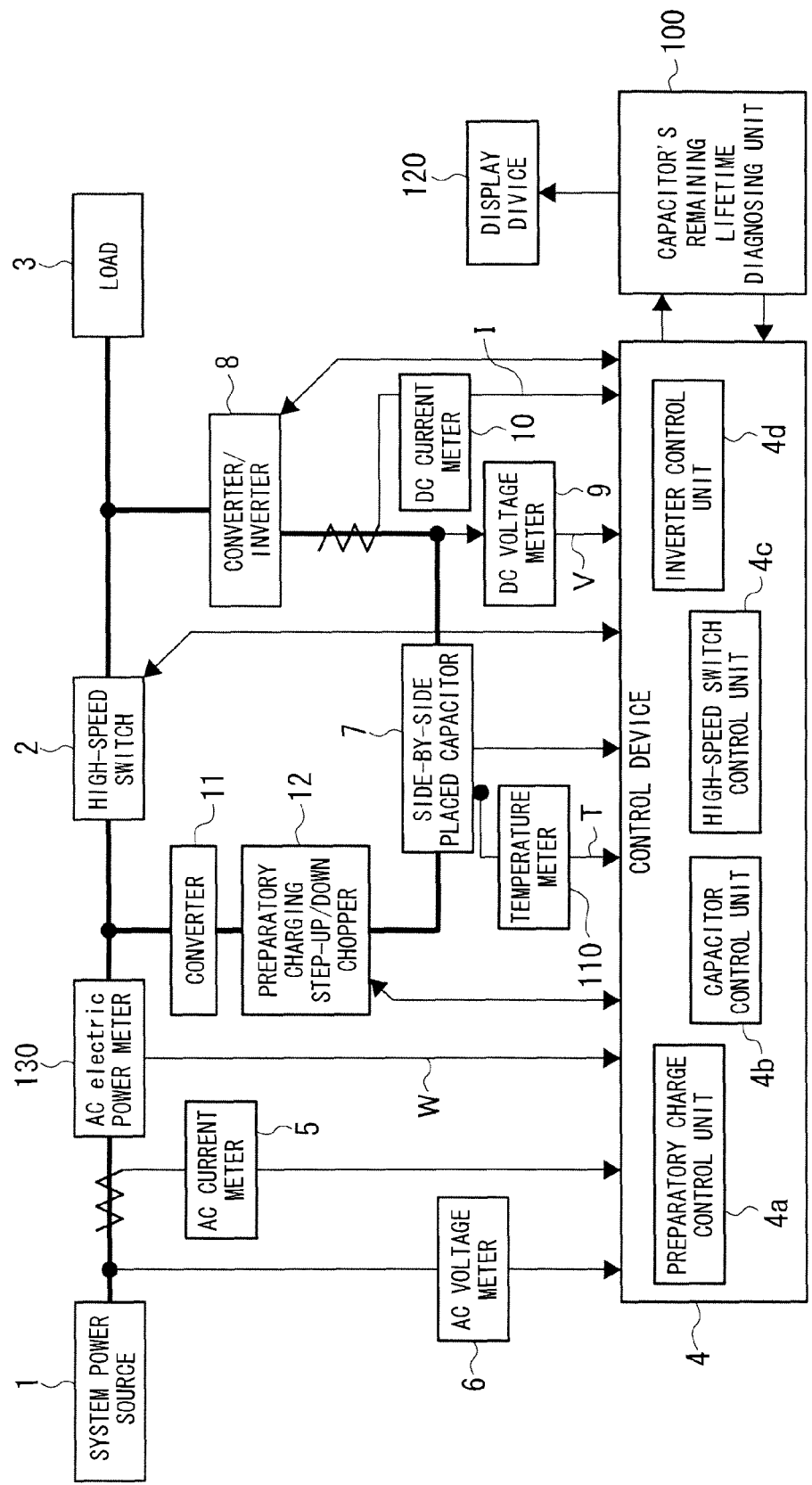
FIG. 10 is a configuration diagram showing an electric power compensating device having a remaining lifetime diagnosing device according to a third example of the present invention.

As shown in FIG. 10, in the third example, an AC electric power meter 130 is provided. This AC electric power meter 130 measures electric power supplied from the system power source 1 to the load 3 when a high-speed switch 2 is in a turned-on state, and outputs an electric power signal W representing a measured power value.

This electric power signal W is sent to a capacitor's remaining lifetime diagnosing unit 100 via the control device 4.

The capacitor's remaining lifetime diagnosing unit 100 has the timer/time integrator 101, the signal input port 102, the data storage RAM 103, the program storage RAM 104, the memory device 105, and the central processing unit (CPU) 106 in the same manner as shown in FIG. 2.

Since the other components and functions are the same as those in the example shown in FIG. 1, the same reference numerals are assigned to the same components, thereby omitting repetitive explanation.

Next, the action of the third example will be explained.

In this example, explanation is made on the assumption that the temperature detected at an occurrence time of an instantaneous drop is, for example, the high temperature (60° C.). Incidentally, as the temperature detected at the occurrence time of the instantaneous drop, an average temperature obtained from temperature history of temperature signals T is adopted.

Figure 11:
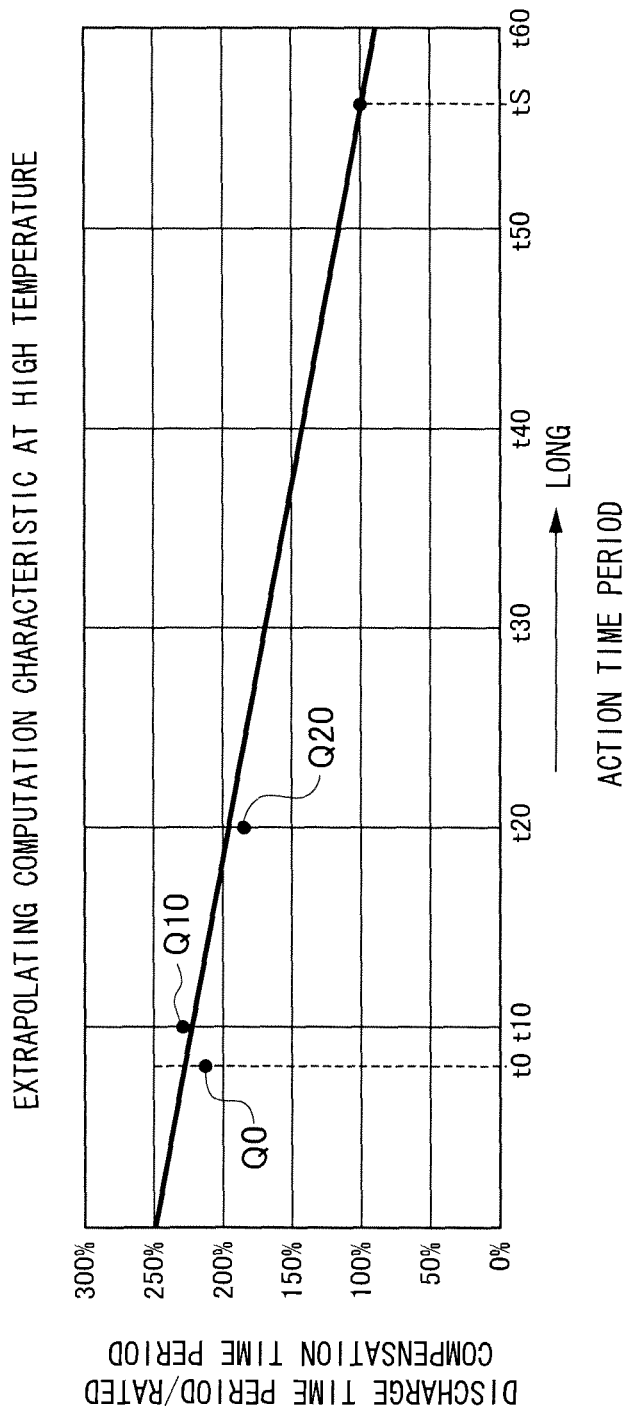
FIG. 11 is a characteristic graph showing a characteristic of "discharge time period/rated compensation time period" obtained by performing extrapolating computation.

First, a percentage Q0 [%] is obtained by dividing a discharge time period at the time point t0 where the instantaneous drop has occurred, which is obtained by the aforementioned discharge time period computing equation (1), by the rated compensation time period. This percentage Q0 [%] at the time point t0 is plotted as shown in FIG. 11.

In this example, the load's required electric power is used as the electric power W when the discharge time period is obtained according to the aforementioned discharge time period computing equation (1).

A capacitance C10 at a time point different from the time point t0, for example, a time point t10, is obtained from one of the characteristics shown in FIG. 3 that corresponds to the temperature at an occurrence time of this instantaneous drop (for example, the high temperature, 60° C.). Further, an internal resistance R10 at the time point t10 is obtained from one of the characteristics shown in FIG. 4 that corresponds to the temperature at the occurrence time of this instantaneous drop (for example, the high temperature, 60° C.).

Next, the capacitance C10 and the internal resistance R10 are applied to the aforementioned discharge time period computing equation (1) to predict the discharge time period of the side-by-side placed capacitor 7 at the time point t10.

In this example, when the discharge time period is obtained according to the aforementioned discharge time period computing equation (1), the load's required electric power is used as the electric power W.

Then, a percentage Q10 [%] is obtained by dividing the discharge time period at the time point t10 (the predicted discharge time period) by the rated compensation time period, and the percentage Q10 [%] at the time point t10 is plotted as shown in FIG. 11.

Next, a capacitance C20 at a time point different from the time points t0 and t10, for example, a time point t20, is obtained from one of the characteristics shown in FIG. 3 that corresponds to the temperature at the occurrence time of this instantaneous drop (for example, the high temperature, 60° C.). Further, an internal resistance R20 at the time point t20 is obtained from one of the characteristics shown in FIG. 4 that corresponds to the temperature at the occurrence time of this instantaneous drop (for example, the high temperature, 60° C.).

Next, the capacitance C20 and the internal resistance R20 are applied to the aforementioned discharge time period computing equation (1) to predict the discharge time period of the side-by-side placed capacitor 7 at the time point t20.

In this example, when the discharge time period is obtained according to the aforementioned discharge time period computing equation (1), the load's required electric power is used as the electric power W.

Then, a percentage Q20 [%] is obtained by dividing the discharge time period at the time point t20 (the predicted discharge time period) by the rated compensation time period, and the percentage Q20 [%] at the time point t20 is plotted as shown in FIG. 11.

In this manner, the percentages Q0 [%], Q10 [%], and Q20 [%] at least three time points (in this example, the time points t0, t10, and t20) are plotted.

Incidentally, in order to further improve accuracy, a percentage at a time point other than the time points t0, t10, and t20 is additionally plotted.

Then, an extrapolating computation characteristic line such as shown in FIG. 11 is obtained by performing extrapolating computation of the plotted percentages Q0 [%], Q10 [%], and Q20 [%].

Since the time point at which this extrapolating computation characteristic line reaches 100% is ts, the capacitor's remaining lifetime diagnosing unit 100 makes a diagnosis indicating that the remaining lifetime X from the time point t0 is (ts−t0).

Incidentally, in the above explanation, the case in which the temperature when the instantaneous drop has occurred (the average temperature obtained from temperature history of the temperature signals T) is the high temperature (60° C.) is taken as an example to make an explanation, but, the temperature when the instantaneous drop has occurred is the intermediate temperature or the low temperature, the capacitance and the internal resistance at the intermediate temperature or the low temperature are obtained by using the characteristics at the intermediate temperature or the low temperature shown in FIGS. 4 and 5.

Further, only temperature characteristics at three types of temperatures (the high temperature, the intermediate temperature, and the low temperature) are shown in FIGS. 4 and 5, but, when the temperature at the occurrence time of the instantaneous drop is another temperature, a regression equation with respect to three characteristic curves is obtained by the method of least squares or the like, and a characteristic curve at the temperature is obtained by using this regression equation.

Then, the characteristic thus obtained is utilized to obtain the capacitance and the internal resistance at the temperature.

The remaining lifetime X obtained at the capacitor's remaining lifetime diagnosing unit 100 is displayed on the display device 120.

Incidentally, when the remaining lifetime X obtained does not reach a guaranteed lifetime period of the instantaneous voltage drop compensating device, or when the percentage (=the discharge time period/rated compensation time period) Q0 [%] obtained at the occurrence time of this instantaneous drop is less than 100%, a warning can be issued.

Incidentally, in the first to third examples described above, the explanations are made on the assumption that the electric power compensating device is the instantaneous voltage drop compensating device, but, it is obvious that the remaining lifetime can also be diagnosed in an uninterrupted power supply in a similar manner.

INDUSTRIAL APPLICABILITY

The present invention can be applied to various electric power compensating devices having an electric accumulator comprising an electric double layer capacitor, as well as the instantaneous voltage drop compensating device or the uninterrupted power supply.

EXPLANATION OF REFERENCE NUMERALS

1: System power source
2: High-speed switch
3: Load
4: Control device
5: AC current meter
6: AC voltage meter
7: Side-by-side placed capacitor
8: Electric power transformer (converter/inverter)
9: DC voltage meter
10: DC current meter
11: Converter
12: Preparatory charging step-up/down chopper
100: Capacitor's remaining lifetime diagnosing unit
110: Temperature meter
120: Display device
121: Bypass switch
122: Resistor
123: DC current meter
124: DC voltage meter
130: AC electric power meter

The invention claimed is:

1. A capacitor's remaining lifetime diagnosing device for diagnosing the remaining lifetime of an electric accumulator comprising an electric double layer capacitor, which is provided in an electric power compensating device, the capacitor's remaining lifetime diagnosing device comprising:

temperature measuring means adapted to measure the temperature of the electric accumulator, voltage measuring means adapted to measure the DC voltage of the electric accumulator, current measuring means adapted to measure DC current outputted by the electric accumulator;

capacitance computing means adapted to compute the capacitance of the electric accumulator, which is obtained when the electric accumulator is in a discharging state, based on the measured voltage measured by the voltage measuring means and the measured current measured by the current measuring means, when the electric accumulator is in the discharging state;

internal resistance computing means adapted to compute the internal resistance of the electric accumulator, which is obtained when the electric accumulator is in the discharging state, based on the measured voltage measured by the voltage measuring means and the measured current measured by the current measuring means, when the electric accumulator is in the discharging state;

discharge time period computing means adapted to compute a discharge time period for which the electric accumulator can discharge while outputting a rated electric power, when the electric accumulator is in the discharging state, based on the capacitance obtained by the capacitance computing means and the internal resistance obtained by the internal resistance computing means; and remaining lifetime computing means adapted to compute a remaining lifetime indicating how much time is left from a time point at which the electric accumulator is put into the discharging state to a time point at which the discharge time period of the electric accumulator becomes less than a rated compensation time period required as a time period for which the electric power compensating device has to output the rated electric power, based on the discharge time period obtained by the discharge time period computing means, the measured temperature obtained by the temperature measuring means, and a prestored remaining lifetime characteristic.

2. The capacitor's remaining lifetime diagnosing device according to claim 1, wherein a plurality of remaining lifetime characteristics under a plurality of temperature conditions are stored as the remaining lifetime characteristic in the remaining lifetime computing means; and the remaining lifetime computing means obtains a remaining lifetime characteristic corresponding the measured temperature, from the plurality of remaining lifetime characteristics, when the measured temperature obtained by the temperature measuring means is different from temperatures of the plurality of temperature conditions, and uses the obtained remaining lifetime characteristic to compute the remaining lifetime.

3. A capacitor's remaining lifetime diagnosing device for diagnosing the remaining lifetime of an electric accumulator comprising an electric double layer capacitor, which is provided in an electric power compensating device, the capacitor's remaining lifetime diagnosing device comprising:

temperature measuring means adapted to measure the temperature of the electric accumulator, voltage measuring means adapted to measure the DC voltage of the electric accumulator, current measuring means adapted to measure DC current outputted by the electric accumulator;

capacitance computing means adapted to compute the capacitance of the electric accumulator, which is obtained when the electric accumulator is in a discharging state, based on the measured voltage measured by the voltage measuring means and the measured current measured by the current measuring means, when the electric accumulator is in the discharging state;

internal resistance computing means adapted to compute the internal resistance of the electric accumulator, which is obtained when the electric accumulator is in the discharging state, based on the measured voltage measured by the voltage measuring means and the measured current measured by the current measuring means, when the electric accumulator is in the discharging state;

discharge time period computing means adapted to compute a discharge time period for which the electric accumulator can discharge while outputting a rated electric power, based on the capacitance of the electric accumulator and the internal resistance of the electric accumulator; and remaining lifetime computing means adapted to compute a remaining lifetime indicating how much time is left from a time point at which the electric accumulator is put into the discharging state to a time point at which the discharge time period of the electric accumulator becomes less than a rated compensation time period required as a time period for which the electric power compensating device has to output the rated electric power, wherein the remaining lifetime computing means:

prestores therein capacitance change rate characteristics representing a characteristic of the capacitance of the electric accumulator changing with the passage of time for respective temperatures, and internal resistance change rate characteristics representing a characteristic of the internal resistance of the electric accumulator changing with the passage of time for the respective temperature;

obtains a percentage by dividing the discharge time period obtained by the discharge time period computing means by the rated compensation time period, based on the capacitance obtained by the capacitance computing means at the time point at which the electric accumulator is put into the discharging state, the internal resistance obtained by the internal resistance computing means at the time point at which the electric accumulator is put into the discharging state, and the rated electric power;

obtains internal resistances at a plurality of time points different from the time point at which the electric accumulator is put into the discharging state, and at the same temperature as that at the time point at which the electric accumulator is put into the discharging state, from the internal resistance change rate characteristics, obtains capacitances at a plurality of time points different from the time point at which the electric accumulator is put into the discharging state, and at the same temperature as that at the time point at which the electric accumulator is put into the discharging state, from the capacitance change rate characteristics, and obtains percentages for a plurality of time points by dividing the discharge time periods for a plurality of time points obtained by the discharge time period computing means by the rated compensation time period, based on the internal resistances and the capacitances for a plurality of time points thus obtained, and the rated electric power; and obtains an extrapolating computation characteristic line by performing extrapolating computation of the respective percentages, obtains a time point at which the extrapolating computation characteristic line reaches 100%, and obtains a time period between the time point at which the extrapolating computation characteristic line reaches 100% and the time point at which the electric accumulator is put into the discharging stage as a remaining life time.

4. An electric power compensating device provided with the capacitor's remaining lifetime diagnosing device according to claim 1, wherein the voltage measuring means is disposed at a position where the DC voltage of the electric accumulator can be measured when an electric power transformer that inversely transforms the electric power of the electric accumulator at a time of electric power compensation is operating, and the current measuring means is disposed at a position where DC current outputted by the electric accumulator can be measured.

5. An electric power compensating device provided with the capacitor's remaining lifetime diagnosing device according to claim 1, wherein the electric power compensating device is provided with a resistor, and a chopper that performs a chopper action to discharge the electric power of the electric accumulator and feed the same to the resistor in which the electric power is consumed; and the voltage measuring means is disposed at a position where the DC voltage of the electric accumulator can be measured when the chopper is performing the chopper action, and the current measuring means is disposed at a position where DC current outputted by the electric accumulator can be measured.

6. A capacitor's remaining lifetime diagnosing device for diagnosing the remaining lifetime of an electric accumulator comprising an electric double layer capacitor, which is provided in an electric power compensating device, the capacitor's remaining lifetime diagnosing device comprising:

temperature measuring means adapted to measure the temperature of the electric accumulator, voltage measuring means adapted to measure the DC voltage of the electric accumulator, current measuring means adapted to measure DC current outputted by the electric accumulator, and electric power measuring means adapted to measure a load's required electric power that is an electric power consumed by a load and power-compensated by the electric power compensating device;

capacitance computing means adapted to compute the capacitance of the electric accumulator, which is obtained when the electric accumulator is in a discharging state, based on the measured voltage measured by the voltage measuring means and the measured current measured by the current measuring means, when the electric accumulator is in the discharging state;

internal resistance computing means adapted to compute the internal resistance of the electric accumulator, which is obtained when the electric accumulator is in the discharging state, based on the measured voltage measured by the voltage measuring means and the measured current measured by the current measuring means, when the electric accumulator is in the discharging state;

discharge time period computing means adapted to compute a discharge time period for which the electric accumulator can discharge while outputting the load' required electric power, based on the capacitance of the electric accumulator, the internal resistance of the electric accumulator, and the load's required electric power; and remaining lifetime computing means adapted to compute a remaining lifetime indicating how much time is left from a time point at which the electric accumulator is put into the discharging state to a time point at which the discharge time period of the electric accumulator becomes less than a rated compensation time period required as a time period for which the electric power compensating device has to output the load's required electric power, wherein the remaining lifetime computing means:

prestores therein capacitance change rate characteristics representing a characteristic of the capacitance of the electric accumulator changing with the passage of time for respective temperatures, and internal resistance change rate characteristics representing characteristics of the internal resistance of the electric accumulator changing with the passage of time for the respective temperatures;

obtains a percentage by dividing the discharge time period obtained by the discharge time period computing means by the rated compensation time period, based on the capacitance obtained by the capacitance computing means at the time point at which the electric accumulator is put into the discharging state, the internal resistance obtained by the internal resistance computing means at the time point at which the electric accumulator is put into the discharging state, and the load's required electric power obtained by the electric power measuring means;

obtains internal resistances at a plurality of time points different from the time point at which the electric accumulator is put into the discharging state, and at the same temperature as that at the time point at which the electric accumulator is put into the discharging state, from the internal resistance change rate characteristics, obtains capacitances at a plurality of time points different from the time point at which the electric accumulator is put into the discharging state, and at the same temperature as that at the time point at which the electric accumulator is put into the discharging state, from the capacitance change rate characteristics, and obtains percentages for a plurality of time points by dividing the discharge time periods for a plurality of time points obtained by the discharge time period computing means by the rated compensation time period, based on the internal resistances and the capacitances for a plurality of time points thus obtained and the load's required electric power obtained by the electric power measuring means; and obtains an extrapolating computation characteristic line by performing extrapolating computation of the respective percentages obtained, obtains a time point at which the extrapolating computation characteristic line reaches 100%, and obtains a time period between the time point at which the extrapolating computation characteristic line reaches 100% and the time point at which the electric accumulator is put into the discharging stage as a remaining lifetime.

* * * * *